(12) United States Patent
Chen

(10) Patent No.: US 6,222,211 B1
(45) Date of Patent: Apr. 24, 2001

(54) MEMORY PACKAGE METHOD AND APPARATUS

(76) Inventor: Han-Ping Chen, P.O. Box 2871, Saratoga, CA (US) 95070

( * ) Notice: Subject to any disclaimer, the term of this patent is extended or adjusted under 35 U.S.C. 154(b) by 0 days.

(21) Appl. No.: 09/443,330

(22) Filed: Nov. 19, 1999

(51) Int. Cl.$^7$ .................................................. H01L 27/10
(52) U.S. Cl. ........................................... 257/206; 257/202
(58) Field of Search .................................. 257/202, 203, 257/206, 204

(56) References Cited

U.S. PATENT DOCUMENTS

| | | |
|---|---|---|
| 4,527,251 * | 7/1985 | Nibby, Jr. et al. . |
| 4,774,700 * | 9/1988 | Satoh et al. . |
| 5,128,737 * | 7/1992 | Van Der Have . |
| 5,712,816 * | 1/1998 | Cappelletti et al. . |
| 5,999,446 * | 12/1999 | Harari et al. . |

* cited by examiner

Primary Examiner—Sheila V. Clark

(57) ABSTRACT

A method and apparatus configures the data bits of partially defective memory devices in order to construct usable memory chip or module packages that meet the specification of a fully or partially functional package.

27 Claims, 10 Drawing Sheets

MEMORY PACKAGE METHOD AND APPARATUS

BACKGROUND OF THE INVENTION

This invention relates to semiconductor memory devices, memory chips, memory modules, and the handling of defective memory components.

Due to the yield limitation of semiconductor fabrication process, a semiconductor memory wafer usually contains defective memory devices. These defective memory devices are declared as unusable because the defects within the device are beyond the repairing capability of the device fabrication process.

We may categorize the types of defective memory devices by the defective data bit positions. For a memory device with eight data bits, there are 255 types of defective memory devices. The large number of defective memory types further complicates the issue regarding to the handling, sorting, and packaging of these memory devices.

BRIEF SUMMARY OF THE INVENTION

This invention proposes a method and apparatus to utilize partially defective memory devices to construct usable memory chip or module packages that meet the specification of a functional package.

This invention provides a method that maximizes the usage of non-defective memory data bits in the partially defective memory devices.

The present invention provides a method that reduces the complexity in the chip and module packaging, sorting, and handling.

This invention further provides a method to reduce the large number of defective memory device types.

DETAILED DESCRIPTION OF THE INVENTION

The present invention will be illustrated with some preferred embodiments.

Figure 1:
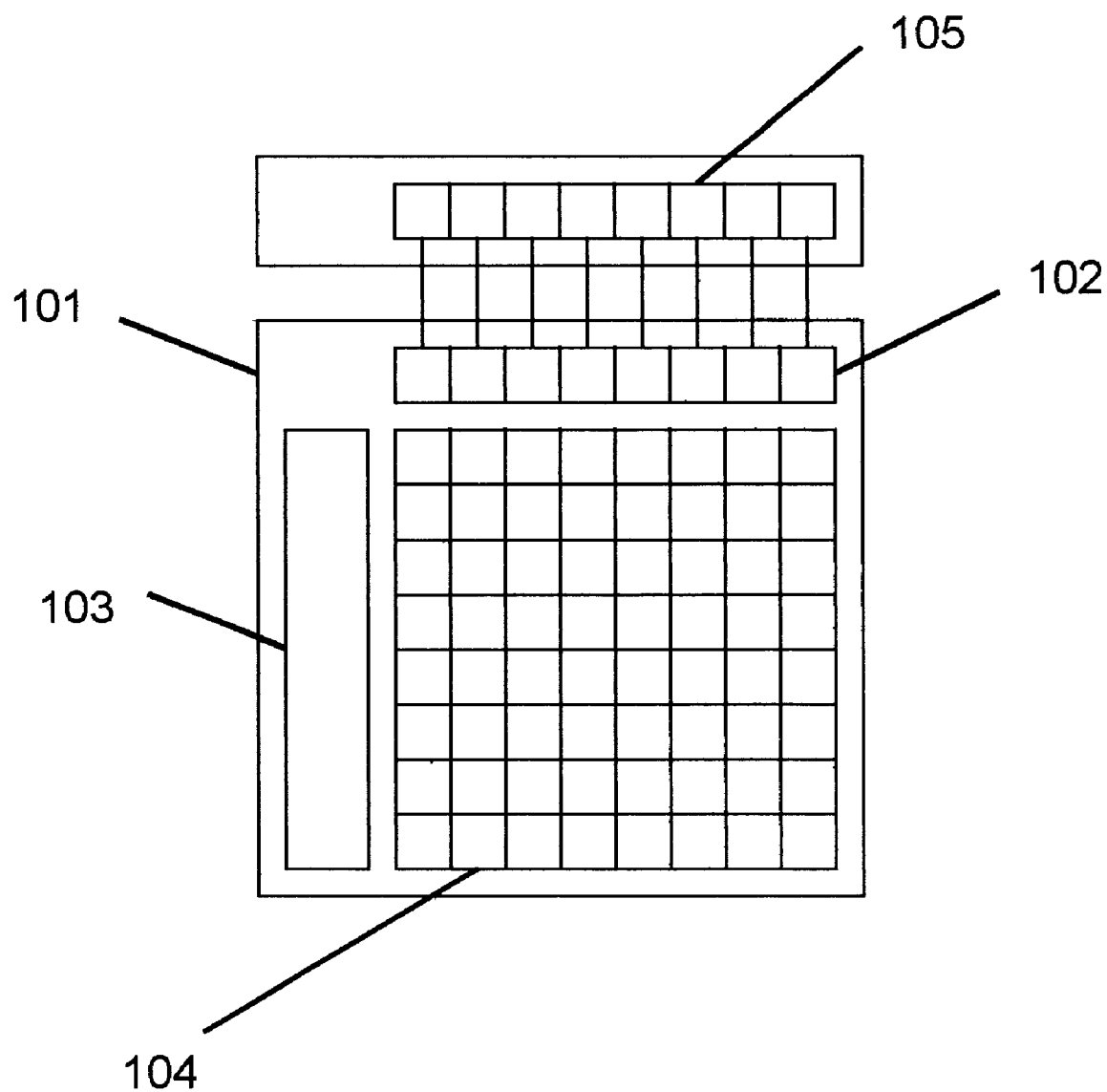
FIG. 1 is a diagram of a prior art memory chip.

FIG. 1 is a diagram of a prior art memory chip. The memory device 101 contains device data bit points 102, a memory address control unit 103, and a memory cell array 104. The device data bit points 102 are connected to the corresponding chip data bit points 105.

Figure 2:
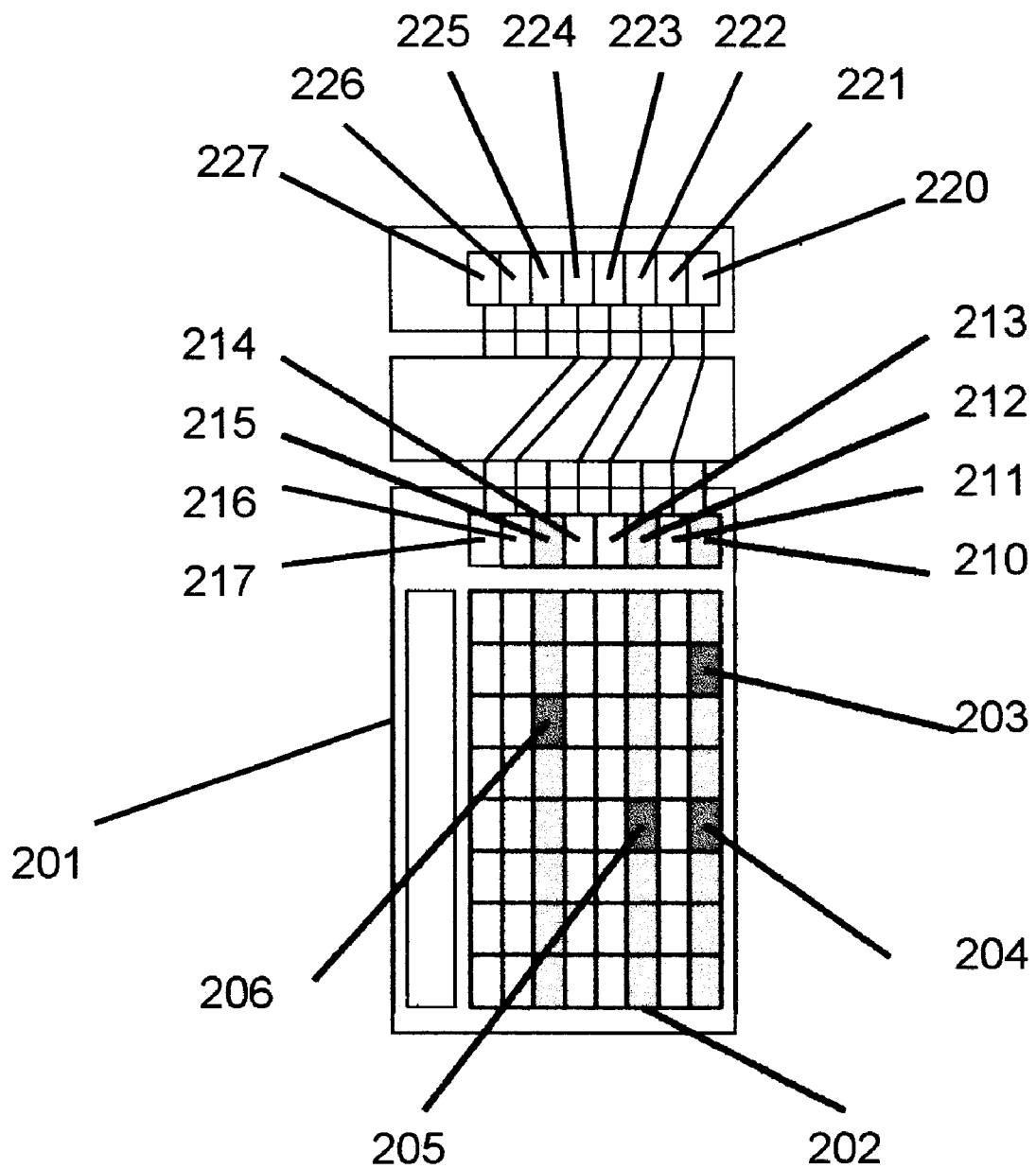
FIG. 2 shows a preferred embodiment of the present invention for a memory chip package.

FIG. 2 shows a preferred embodiment of the present invention for a memory chip package. In memory device 201, the memory cell array 202 contains defective memory cells within memory blocks 203, 204, 205, and 206.

The memory data bits corresponding to device data bit points 211, 213, 214, 216 and 217 are marked as functional because they do not contain any defective memory blocks. These data bit points are mapped onto chip data bit points 220, 221, 222, 223, and 224, each with a connecting mechanism. In this preferred embodiment, the connecting mechanisms are metal wires during a wire bonding process.

The memory data bits corresponding to device data bit points 210, 212, and 215 are marked as defective because they contain at least one defective memory blocks. These data bit points are mapped onto chip data bit points 225, 226, and 227, each with a disconnecting mechanism. In this preferred embodiment, the disconnecting mechanisms are open circuit conditions without any wire connections.

Figure 3:
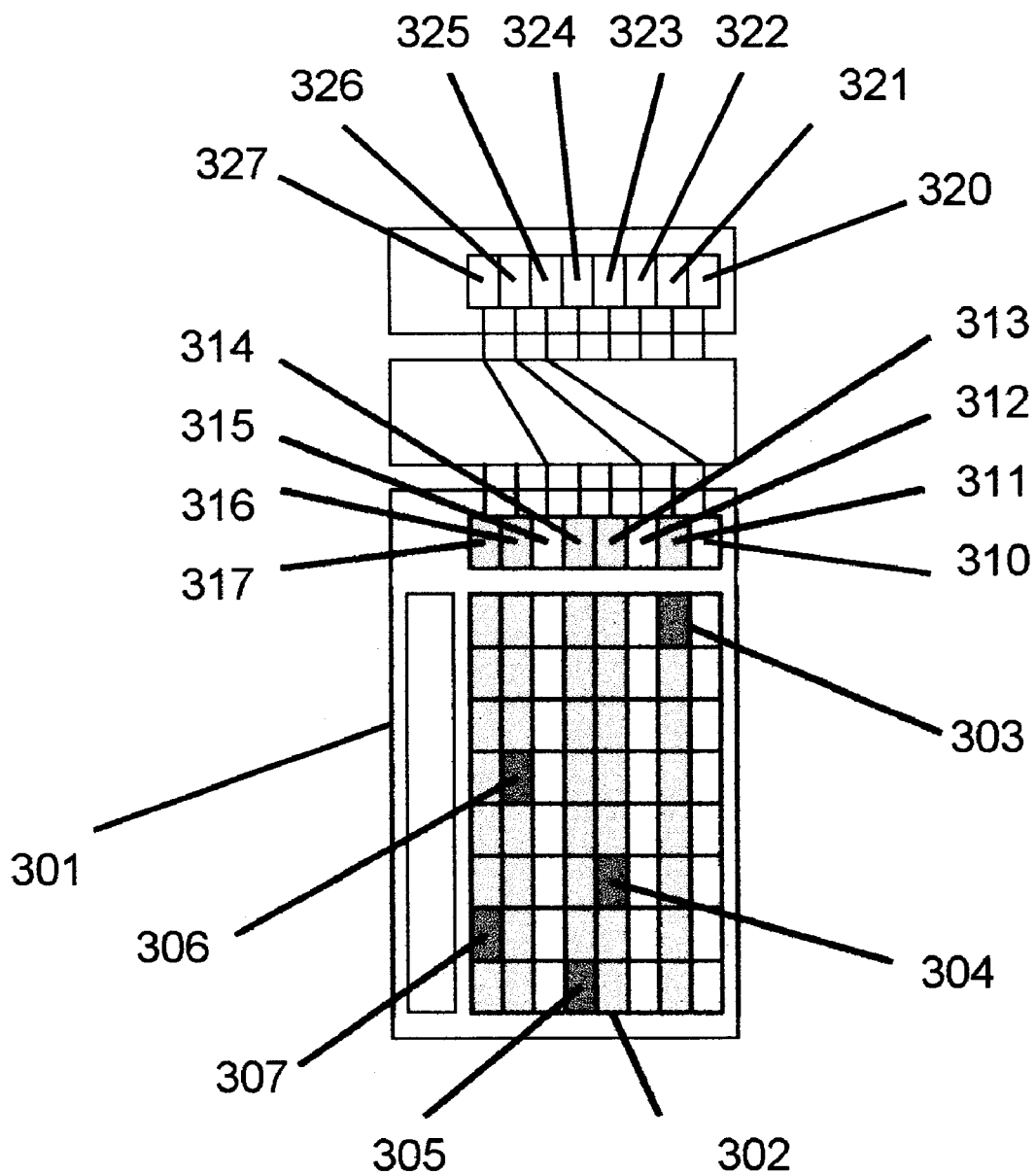
FIG. 3 shows another preferred embodiment of the present invention for a memory chip package.

FIG. 3 shows another preferred embodiment of the present invention for a memory chip package. In memory device 301, the memory cell array 302 contains defective memory cells within memory blocks 303, 304, 305, 306, and 307.

The memory data bits corresponding to device data bit points 310, 312, and 315 are marked as functional because they do not contain any defective memory blocks. These data bit points are mapped onto chip data bit points 325, 326, and 327, each with a connecting mechanism. In this preferred embodiment, the connecting mechanisms are metal wires during a wire bonding process.

The memory data bits corresponding to device data bit points 311, 313, 314, 316 and 317 are marked as defective because they contain at least one defective memory blocks. These data bit points are mapped onto chip data bit points 320, 321, 322, 323, and 324, each with a disconnecting mechanism. In this preferred embodiment, the disconnecting mechanisms are open circuit conditions without any wire connections.

Figure 4:
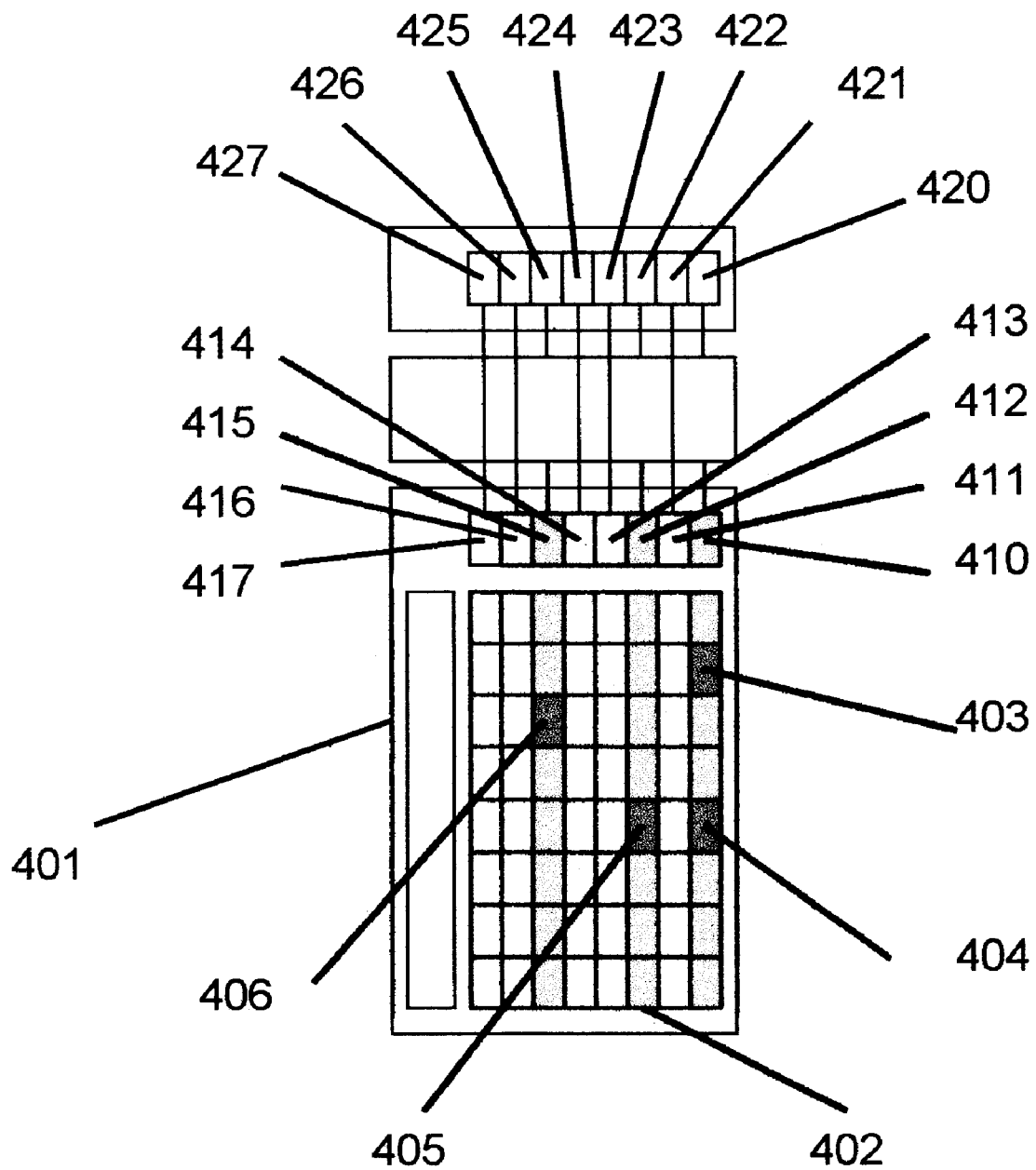
FIG. 4 shows a third preferred embodiment of the present invention for a memory chip package.

FIG. 4 shows a third preferred embodiment of the present invention for a memory chip package. In memory device 401, the memory cell array 402 contains defective memory cells within memory blocks 403, 404, 405, and 406.

The memory data bits corresponding to device data bit points 411, 413, 414, 416 and 417 are marked as functional because they do not contain any defective memory blocks. These data bit points are mapped onto chip data bit points 421, 423, 424, 426, and 427, each with a connecting mechanism. In this preferred embodiment, the connecting mechanisms are metal wires during a wire bonding process.

The memory data bits corresponding to device data bit points 410, 412, and 415 are marked as defective because they contain at least one defective memory blocks. These data bit points are mapped onto chip data bit points 420, 422, and 425, each with a disconnecting mechanism. In this preferred embodiment, the disconnecting mechanisms are open circuit conditions without any wire connections.

Figure 5:
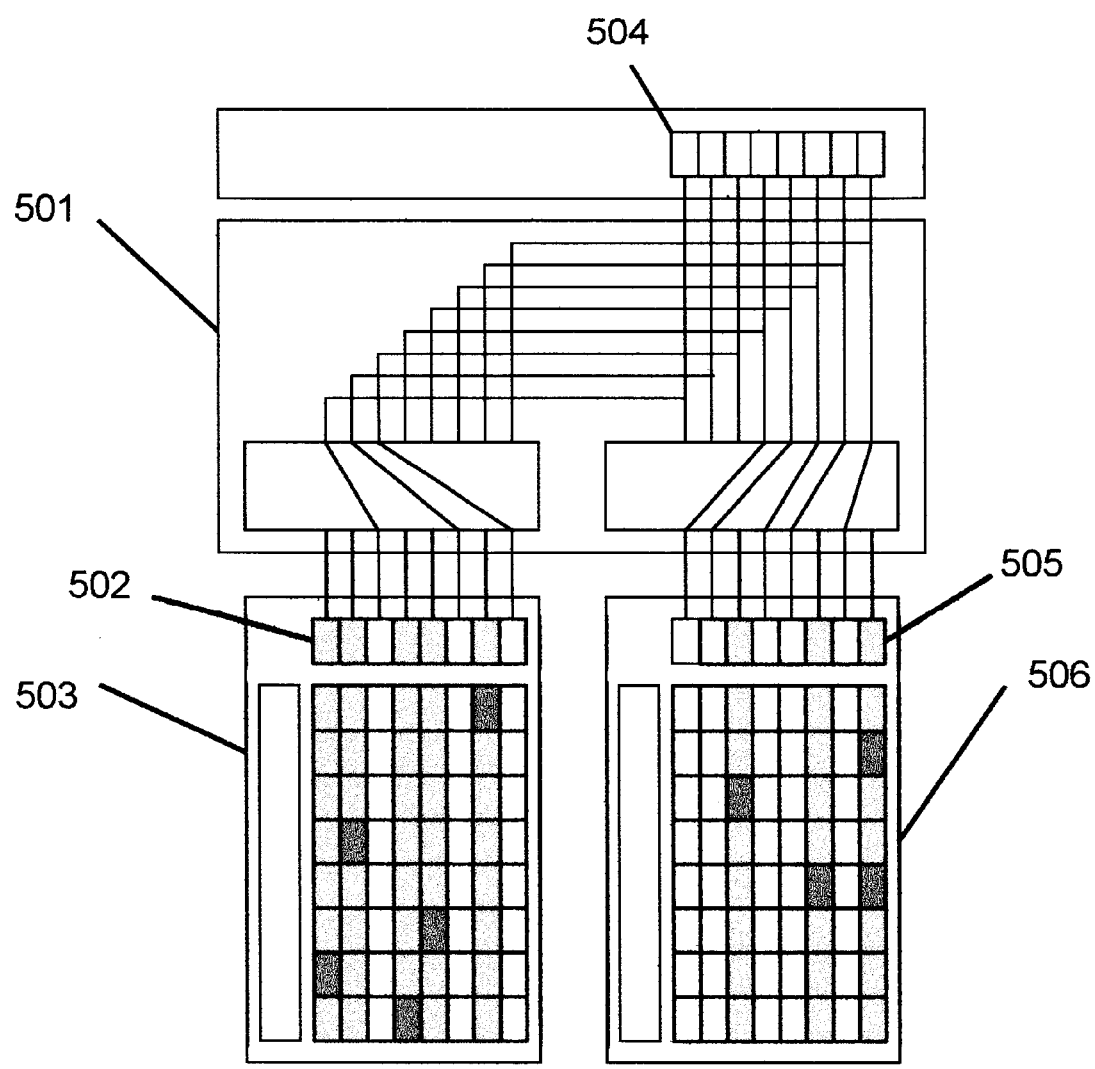
FIG. 5 shows a preferred embodiment of the present invention for a memory chip package with two memory devices.

FIG. 5 shows a preferred embodiment of the present invention for a memory chip package with two memory devices. The data bit mapping element 501 maps the device data bit points 502 of the memory device 503 to selected package data bit points 504 using a mapping structure similar to FIG. 2. It also maps the device data bit points 505 of the memory device 506 to remaining package data bit points using a mapping structure similar to FIG. 3.

Figure 6:
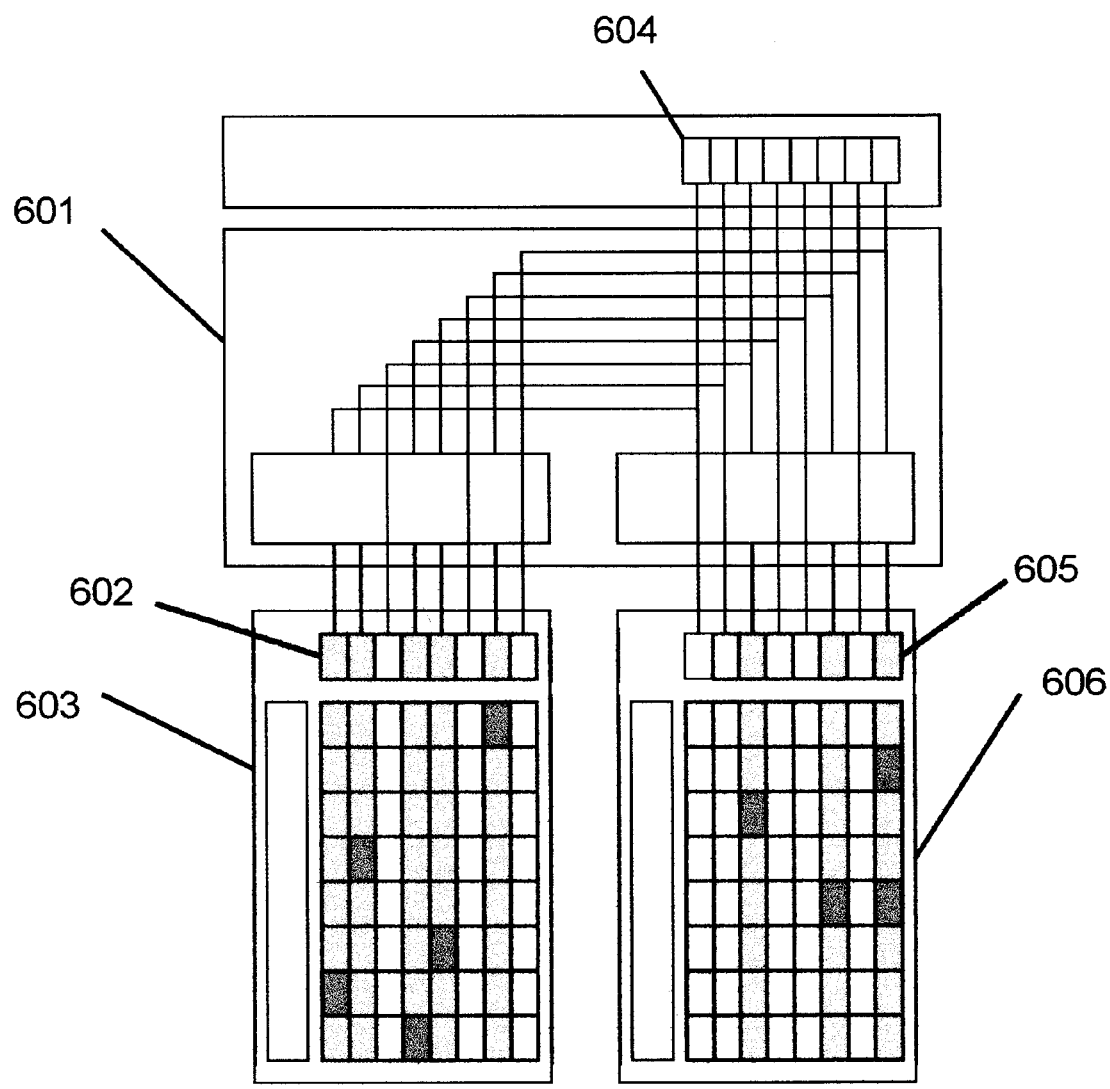
FIG. 6 shows another preferred embodiment of the present invention for a memory chip package with two memory devices.

FIG. 6 shows a preferred embodiment of the present invention for a memory chip package with two memory devices. The data bit mapping element 601 maps the device data bit points 602 of the memory device 603 to selected package data bit points 604 using a mapping structure similar to FIG. 4. It also maps the device data bit points 605 of the memory device 606 to remaining package data bit points using a similar mapping structure.

Figure 7:
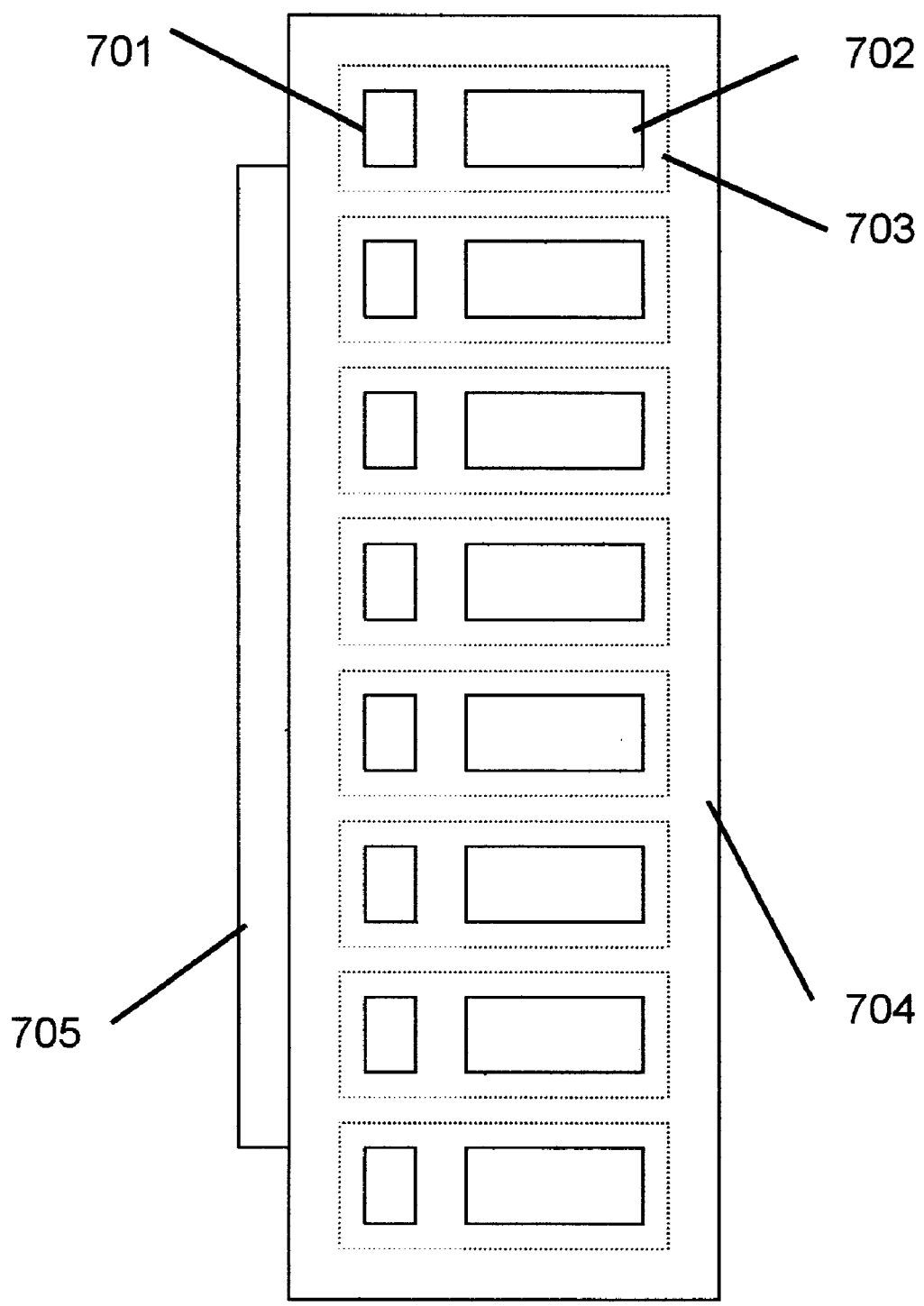
FIG. 7 is a diagram of a prior art memory module.

FIG. 7 is a diagram of a prior art memory module. The memory module data bit points 701 are connected to the corresponding chip data bit points of the memory device 702. This combination constitutes a memory unit 703. This memory module contains a total of eight memory units. The module is built on a printed circuit board 704 with an edge connection 705 to interface with other system components.

Figure 8:
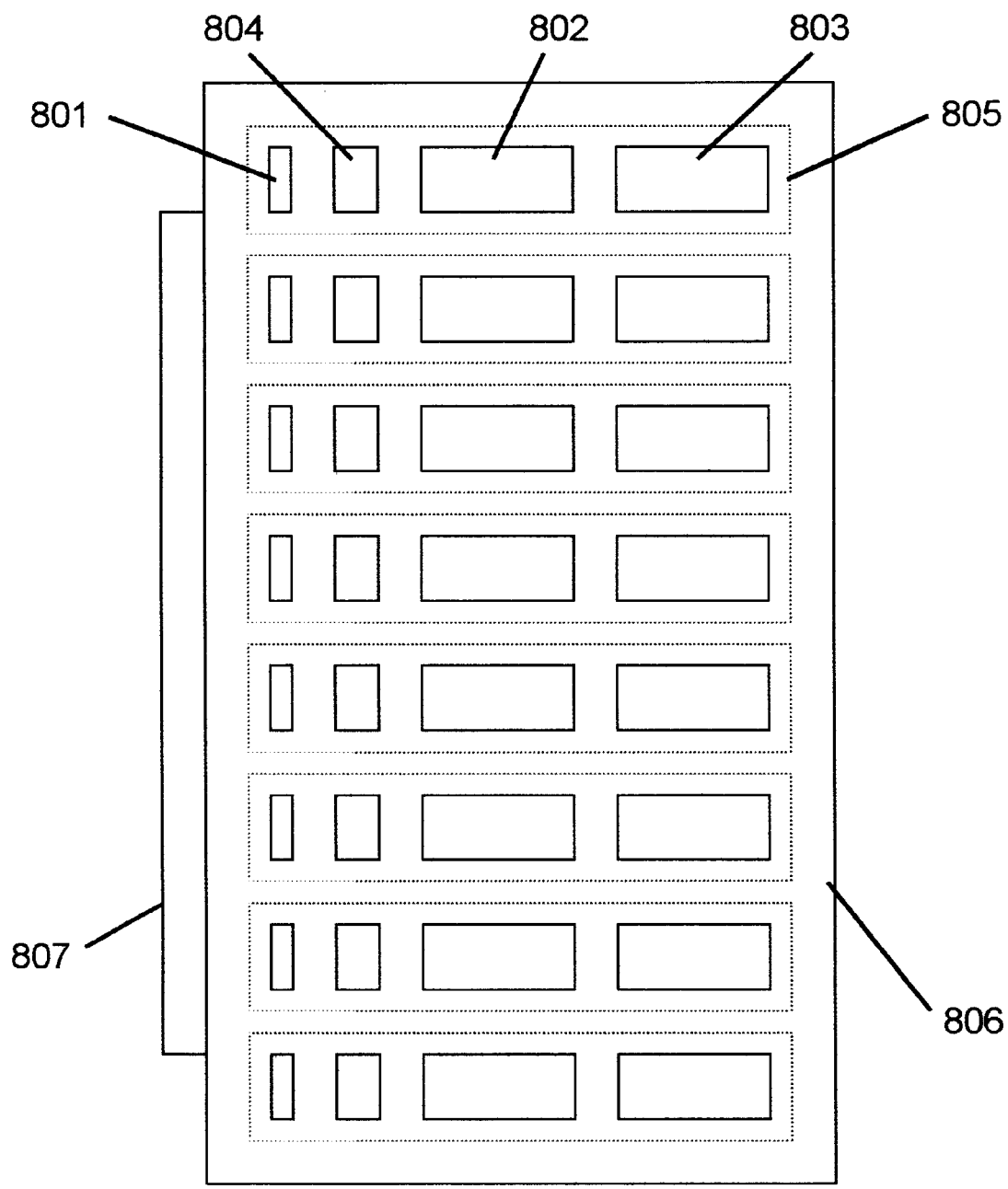
FIG. 8 shows a preferred embodiment of the present invention for a memory module package.

FIG. 8 shows a preferred embodiment of the present invention for a memory module package. The data bit mapping element 804 maps the chip data bit points of the first memory chip 802 and second memory chip 803 to the memory module data bit points 801. This combination constitutes a memory unit 805. This memory module contains a total of eight memory units. The module is built on a printed circuit board 806 with an edge connection 807 to interface with other system components.

Figure 9:
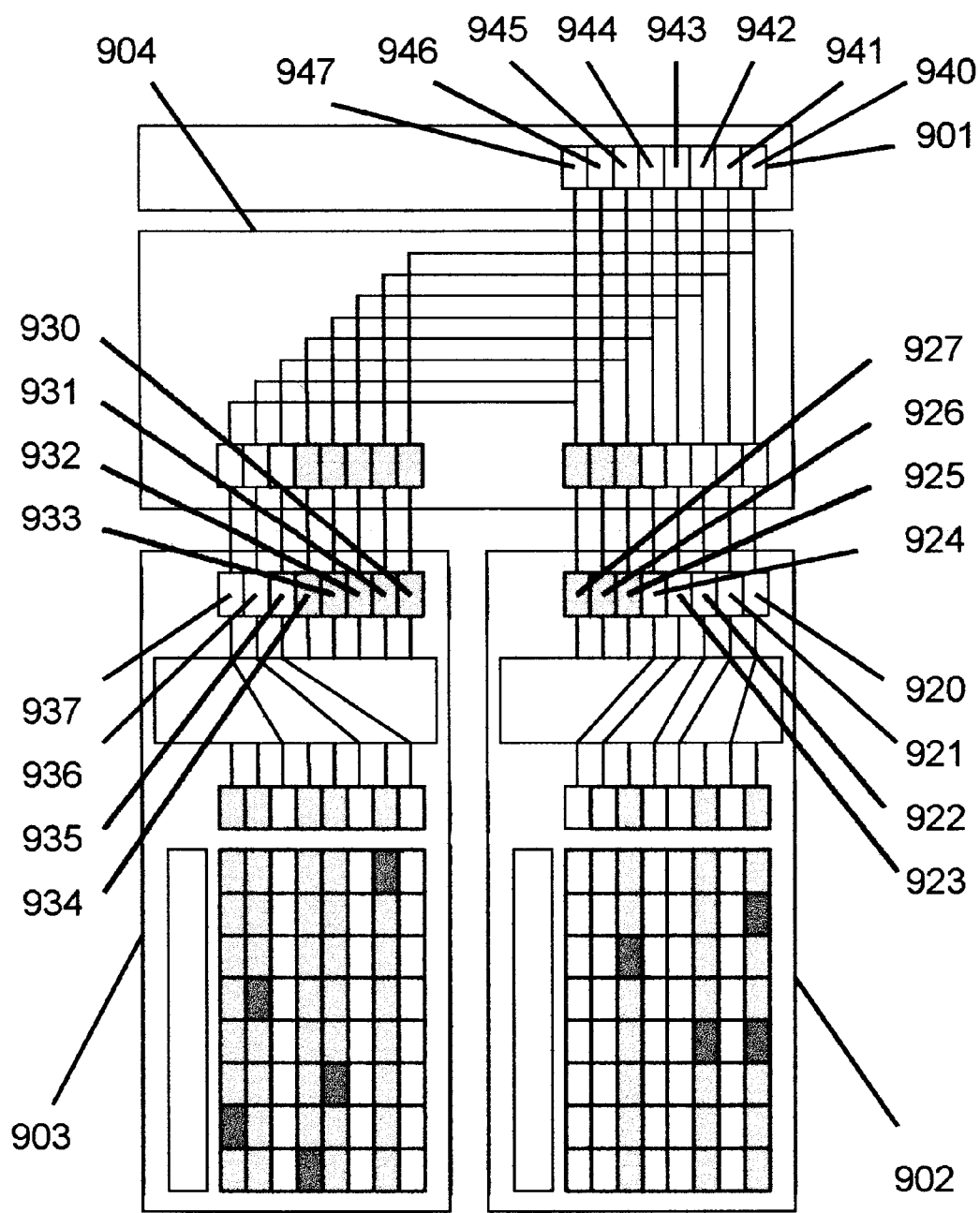
FIG. 9 shows a preferred embodiment for a portion of the memory module package in FIG. 8.

FIG. 9 shows a preferred embodiment for a memory unit of the memory module package in FIG. 8. The data bit mapping element 904 maps the chip data bit points of the first memory chip 902 and second memory chip 903 to the memory module data bit points 901.

For the first memory chip 902, the memory chip data bit points 920, 921, 922, 923, 924, 925, 926, and 927 are mapped onto module data bit points 940, 941, 942, 943, 944, 945, 946, and 947, each with a connecting mechanism. In this preferred embodiment, the connecting mechanisms are low value resistors. However, only the memory chip data bit points 920, 921, 922, 923, and 924 are mapped onto by device data bit points within the first memory chip 902 as illustrated in FIG. 2.

For the second memory chip 903, the memory chip data bit points 930, 931, 932, 933, 934, 935, 936, and 937 are also mapped onto module data bit points 940, 941, 942, 943, 944, 945, 946, and 947, each with a connecting mechanism. In this preferred embodiment, the connecting mechanisms are low value resistors. However, only the memory chip data bit points 935, 936, and 937 are mapped onto by device data bit points within the first memory chip 903 as illustrated in FIG. 3.

Figure 10:
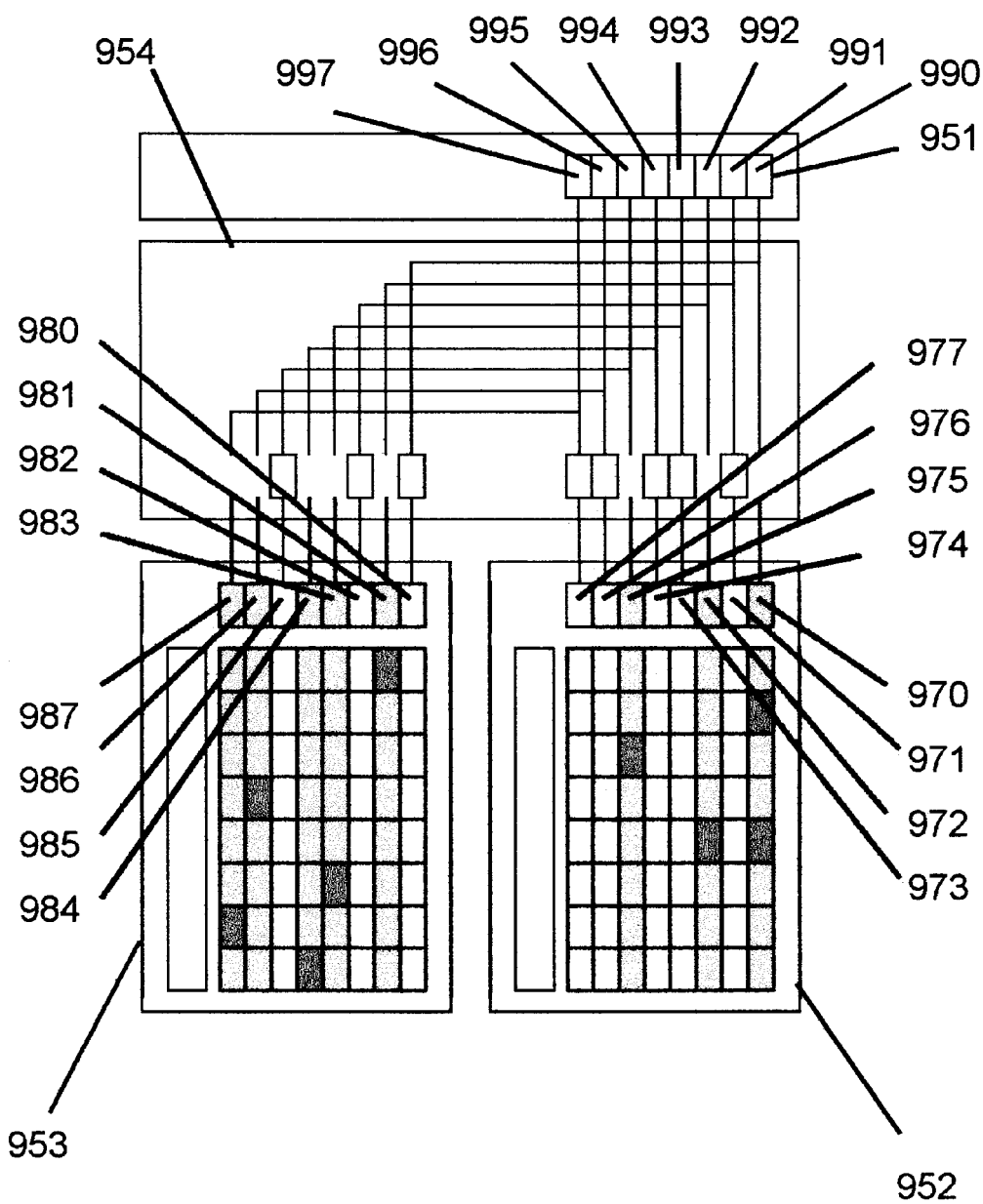
FIG. 10 shows another preferred embodiment of a portion for the memory module package in FIG. 8.

FIG. 10 shows another preferred embodiment for a memory unit of the memory module package in FIG. 8. The data bit mapping element 954 maps the chip data bit points of the first memory chip 952 and second memory chip 953 to the memory module data bit points 951.

For the first memory chip 952, the memory chip data bit points 971, 973, 974, 976 and 977 are mapped onto module data bit points 991, 993, 994, 996 and 997, each with a connecting mechanism. In this preferred embodiment, the connecting mechanisms are low value resistors. The memory chip data bit points 970, 972, and 975 are mapped onto module data bit points 990, 992, and 995, each with a disconnecting mechanism. In this preferred embodiment, the disconnecting mechanisms are open circuits without any connections.

For the second memory chip 953, the memory chip data bit points 980, 982, and 985 are mapped onto module data bit points 990, 992, and 995, each with a connecting mechanism. In this preferred embodiment, the connecting mechanisms are low value resistors. The memory chip data bit points 981, 983, 984, 986 and 987 are mapped onto module data bit points 991, 993, 994, 996 and 997, each with a disconnecting mechanism. In this preferred embodiment, the disconnecting mechanisms are open circuits without any connections.

I claim:

1. A memory chip or module package comprising:
a plurality of package data bit points for input or output;
one or more memory sub-packages, at least one of which is defective, each having a plurality of sub-package data bit points for input or output;
a mapping mechanism that maps the sub-package data bit points to the package data bit points;
wherein for a first defective sub-package there is a second defective sub-package such that for each defective sub-package data bit in the first sub-package there is a functional sub-package data bit at the corresponding position in the second sub-package;
wherein for each package data bit point there is at least one sub-package data bit point that is mapped to it with a connecting mechanism.

2. The memory package of claim 1, wherein the package is a semiconductor memory chip and the sub-package is a semiconductor memory device die.

3. The memory package of claim 1, wherein the package is a memory module and the sub-package is a memory chip.

4. The memory package of claim 1, wherein the connecting mechanism is a wire connection, which may be a bonding wire.

5. The memory package of claim 1, wherein the connecting mechanism is a low-impedance material, which may be a low-value resistor or a zero-ohm resistor.

6. The memory package of claim 1, wherein the connecting mechanism is a logic circuit that is controlled by other signals.

7. The memory package of claim 1, further comprising a circuit connection base that may be used for different defective memory types having different combination of defective data bit positions.

8. The memory package of claim 7, wherein the circuit connection base is a printed circuit board.

9. The memory package of claim 7, wherein the circuit connection base is a die bond carrier.

10. A memory chip or module package comprising:
a plurality of package data bit points for input or output;
one or more memory sub-packages, each having a plurality of sub-package data bit points for input or output;
one or more memory devices, at least one of which is defective, each having a plurality of device data bit points for input or output;
a sub-package mapping mechanism that maps the sub-package data bit points to the package data bit points;
a device mapping mechanism that maps the device data bit points to the sub-package data bit points;
wherein for each package data bit point there is at least one sub-package data bit point that is mapped onto it with a low-impedance component;
wherein there is at least one sub-package data bit point that is not mapped onto a package data bit point with a low-impedance component;
wherein for each sub-package data bit point that is mapped onto a package data bit with a low-impedance component, there is a device data bit point that is mapped onto the sub-package data bit point with a connecting mechanism.

11. The memory package of claim 10, wherein the connecting mechanism is a wire connection, which may be a bonding wire.

12. The memory package of claim 10, wherein the connecting mechanism is a low-impedance material, which may be a low-value resistor or a zero-ohm resistor.

13. The memory package of claim 10, wherein the connecting mechanism is a logic circuit that is controlled by other signals.

14. A memory chip or module package comprising:
a plurality of package data bit points for input or output;
one or more memory sub-packages, each having a plurality of sub-package data bit points for input or output;
one or more memory devices, at least one of which is defective, each having a plurality of device data bit points for input or output;
a sub-package mapping mechanism that maps the sub-package data bit points to the package data bit points;
a device mapping mechanism that maps the device data bit points to the sub-package data bit points;
wherein for each package data bit point there is at least one sub-package data bit point that is mapped onto the package data bit point with a low-impedance component;
wherein for each sub-package data bit point that is mapped onto a package data bit with a low-impedance component, there is a device data bit point that is mapped onto the sub-package data bit point with a connecting mechanism;
wherein there is at least one device data bit point that is not mapped onto a sub-package data bit point with a connecting mechanism.

15. The memory package of claim 14, wherein the connecting mechanism is a wire connection, which includes a bonding wire.

16. The memory package of claim 14, wherein the connecting mechanism is a low-impedance material, which includes low-value resistor and zero-ohm resistor.

17. The memory package of claim 14, wherein the connecting mechanism is a logic circuit that is controlled by other signals.

18. A memory chip or module package comprising:
a plurality of package data bit points for input or output;
one or more memory sub-packages, each having a plurality of sub-package data bit points for input or output;
one or more memory devices, at least one of which is defective, each having a plurality of device data bit points for input or output;
a sub-package mapping mechanism that maps the sub-package data bit points to the package data bit points;
a device mapping mechanism that maps the device data bit points to the sub-package data bit points;
wherein for each package data bit point there is at least one sub-package data bit point that is mapped to the package data bit point with a low-impedance component;
wherein for each sub-package data bit point that is mapped onto a package data bit with a low-impedance component, there is a device data bit point that is mapped onto the sub-package data bit point with a connecting mechanism;
wherein there is at least one device data bit point that is mapped onto a sub-package data bit point other than the corresponding sub-package data bit point position with a connecting mechanism.

19. The memory package of claim 18, wherein the connecting mechanism is a wire connection, which includes a bonding wire.

20. The memory package of claim 18, wherein the connecting mechanism is a low-impedance material which includes low-value resistor and zero-ohm resistor.

21. The memory package of claim 18, wherein the connecting mechanism is a logic circuit that is controlled by other signals.

22. A memory chip or module package comprising:
a plurality of package data bit points for input or output;
one or more memory sub-packages, each having a plurality of sub-package data bit points for input or output;
one or more memory devices, at least one of which is defective, each having a plurality of device data bit points for input or output;
a sub-package mapping mechanism that maps the sub-package data bit points to the package data bit points;
a device mapping mechanism that maps the device data bit points to the sub-package data bit points;
wherein for each package data bit point there is at least one sub-package data bit point that is mapped to the package data bit point with a first connecting mechanism;
wherein for each sub-package data bit point that is mapped onto a package data bit point with a first connecting mechanism, there is a device data bit point that is mapped onto the sub-package data bit point with a second connecting mechanism;
wherein there is at least one device data bit point that is mapped onto a sub-package data bit point other than the corresponding sub-package data bit point position with a second connecting mechanism.

23. A memory chip package comprising:
a plurality of package data bit points for input or output;
one or more memory devices, at least one of which is defective, each having a plurality of device data bit points for input or output;
a mapping mechanism that maps the device data bit points to the package data bit points;
wherein the number of device data bit points for each device is the same as the number of the corresponding package data bit points;
wherein for each device at least one device data bit point is mapped to a selected package data bit point through a connecting mechanism;
wherein at least one device data bit point is not mapped to a selected package data point through a connecting mechanism.

24. A memory chip package comprising:
a plurality of package data bit points for input or output;
one or more memory devices, at least one of which is defective, each having a plurality of device data bit points for input or output;
a mapping mechanism that maps the device data bit points to the package data bit points;
wherein the number of device data bit points for each device is the same as the number of the corresponding package data bit points;
wherein for each device at least one device data bit point is mapped to a selected package data bit point that is not the corresponding data bit position through a connecting mechanism.

25. A memory chip package comprising:
a plurality of package data bit points for input or output;
a memory device, having a plurality of device data bit points for input or output, with at least one defective data bit;
a mapping mechanism that maps the device data bit points to the package data bit points;
wherein at least a first package data bit point is mapped onto from a device data bit point with a connecting mechanism;
wherein at least a second package data bit point is not mapped onto from any device data bit point with a connecting mechanism.

26. A memory chip package comprising:

a plurality of package data bit points for input or output;

a memory devices, with at least one defective data bit, having a plurality of device data bit points for input or output;

a mapping mechanism that maps the device data bit points to the package data bit points;

wherein the number of device data bit points for each device is the same as the number of the package data bit points;

wherein for each package data bit point there is a device data bit point that is mapped to the package data bit point with a connecting mechanism;

wherein at least one device data bit point is mapped to a selected package data bit point that is not the corresponding data bit position through a connecting mechanism.

27. A memory die package comprising:

a plurality of package data bit points for input or output;

a memory cell array, with at least one defective data bit, having a plurality of array data bit points for input or output;

a mapping mechanism that maps the array data bit points to the die data bit points;

wherein at least a first die data bit point is mapped onto from a cell array data bit point with a connecting mechanism;

wherein at least a second die data bit point is not mapped onto from any cell array data bit point with a connecting mechanism.

* * * * *